United States Patent [19]

Taka et al.

[11] Patent Number: 4,853,342
[45] Date of Patent: Aug. 1, 1989

[54] METHOD OF MANUFACTURING SEMICONDUCTOR INTEGRATED CIRCUIT DEVICE HAVING TRANSISTOR

[75] Inventors: Shin-ichi Taka, Yokosuka; Jiro Ohshima, Kawasaki, both of Japan

[73] Assignee: Kabushiki Kaisha Toshiba, Kawasaki, Japan

[21] Appl. No.: 300,224

[22] Filed: Jan. 24, 1989

Related U.S. Application Data

[63] Continuation of Ser. No. 231,035, Aug. 11, 1988, abandoned.

[30] Foreign Application Priority Data

Aug. 14, 1987 [JP] Japan .................................. 62-202664

[51] Int. Cl.⁴ .......................................... H01L 21/265
[52] U.S. Cl. ...................................... 437/31; 437/101; 437/228; 437/24; 437/33; 437/238; 148/DIG. 10; 148/DIG. 11; 357/34; 357/59 H
[58] Field of Search ...................... 437/31, 32, 33, 228, 437/233, 101, 235, 238, 24, 247, 174; 148/DIG. 10, DIG. 11; 357/34, 35, 59 H; 156/653, 657

[56] References Cited

U.S. PATENT DOCUMENTS 4,504,332 3/1985 Shinada ................................ 437/31
4,616,404 10/1986 Wang ................................... 437/31
4,651,410 3/1987 Feygensan .......................... 437/31
4,663,831 5/1987 Birrittella .............................. 437/33
4,717,681 1/1988 Curran ................................. 437/31

OTHER PUBLICATIONS

Yasuo Kunii et al., "Solid-Phase Laterial Epitaxy of Chemical-Vapor Deposited Amorphous Silicon by Furnace Annealing", J. Appl. Phys. 54(5), May 1983, pp. 2847-2849.
Ishiwara et al., "Lateral Solid Phase Epitaxy of Amorphous Si Films on Si Subsrates with SiO₂ Patterns", Appl. Phys. Lett. 43(11), Dec. 1, 1983, pp. 1028-1030.

Primary Examiner—Brian E. Hearn
Assistant Examiner—Kevin McAndrews
Attorney, Agent, or Firm—Finnegan, Henderson, Farabow, Garrett, & Dunner

[57] ABSTRACT

A transistor is formed according to the solid phase epitaxial growth which is one of the semiconductor integrated circuit device manufacturing techniques. A low-concentration impurity region is formed by selective solid phase epitaxial growth instead of using an epitaxial substrate. The solid phase epitaxial growth is performed twice, when a collector region is formed and when a base region is formed. The depth of collector and base regions are determined by the thickness of the solid phase growth layers, respectively.

20 Claims, 13 Drawing Sheets

METHOD OF MANUFACTURING SEMICONDUCTOR INTEGRATED CIRCUIT DEVICE HAVING TRANSISTOR

This application is a continuation of application Ser. No. 231,035, filed Aug. 11, 1988 abandoned.

BACKGROUND OF THE INVENTION

1. Field of the Invention

The present invention relates to a method of manufacturing a semiconductor integrated circuit device having a transistor and, more particularly, to a method of manufacturing a high-speed, high-integration density semiconductor integrated circuit device.

2. Description of the Related Art

An SST-1A process, which is developed by NTT (Nihon Telephone and Telegram Inc.), is known as a conventional method of manufacturing a bipolar transistor. This process is described in IEDM-INTERNATIONAL ELECTRON DEVICES MEETING, 1983, pp. 16, T. Sakai and M. Suzuki.

In the conventional method of manufacturing a transistor using the above SST-IA process, however, when a high-speed element (e.g., a bipolar transistor) is to be formed, various problems are posed, i.e., impurity redistribution occurs, high-precision control of the depth and carrier density distribution of an active layer is difficult, and the manufacturing cost is increased.

The above impurity redistribution occurs because a donor is diffused from an $n^+$-type buried region toward an overlying $n^-$-type epitaxial layer. A thin epitaxial layer disappears because of this impurity redistribution. In addition, the carrier density distribution of the $n^-$-type collector region composed of the epitaxial layer is disturbed due to the influences of the diffusion of the donor. For this reason, it is difficult to control the carrier density distribution of the collector region.

The high precision control of the depth and the carrier density distribution of the active layer is difficult for the following reasons. In the SST-1A process, ion-implantation is employed as a method of forming a base region. However, if impurity ions are deeply implanted into a substrate by using the ion-implantation method, the impurity distribution is widely spread. For this reason, it is difficult to obtain a desired carrier density distribution. Furthermore, in order to obtain a steep distribution curve of the implanted impurity, the impurity must be diffused by annealing after ion-implantation is performed at a low acceleration energy. At the same time, this region must be activated to obtain a desired carrier density distribution. However, it is difficult to control the carrier density distribution by utilizing such a method, and moreover, impurity redistribution is caused during the annealing process.

The manufacturing cost is increased because of the following reasons. Since formation of a thin, uniform epitaxial layer on a semiconductor wafer and of a buried layer is difficult, the cost of wafer is inevitably increased. In addition, when a semiconductor element is to be formed in such a wafer, element isolation must be performed by using an element isolation technique requiring a complicated process such as trench isolation. Therefore, the manufacturing cost is increased in this respect as well.

SUMMARY OF THE INVENTION

It is, therefore, an object of the present invention to provide a method of manufacturing a semiconductor integrated circuit device, which can manufacture a high-speed transistor by a relatively simple manufacturing process with excellent controllability and at low cost.

According to an aspect of the present invention, there is provided a method of manufacturing a semiconductor integrated circuit device, comprising the steps of selectively forming a high-concentration impurity region of a second conductivity type in a major surface region of a semiconductor substrate of a first conductivity type, forming a first thermal oxide film on a major surface of the semiconductor substrate, forming a first insulating layer on the first thermal oxide film, forming first and second openings in prospective base/emitter and collector regions, respectively, of the first insulating layer and the first thermal oxide film on the high-concentration impurity region, burying/forming a first semiconductor layer consisting of an amorphous or polycrystalline semiconductor in the first and second openings, doping an impurity of the second conductivity type in the first semiconductor layer, forming first and second buried semiconductor regions serving as a collector region by recrystallizing the first semiconductor layer in the same crystal orientation as that of the semiconductor substrate, forming a second thermal oxide film by thermally oxidizing surfaces of the first and second semiconductor buried regions, forming a second semiconductor layer consisting of an amorphous or polycrystalline semiconductor on the second thermal oxide film, doping an impurity of the first conductivity type in the second semiconductor layer, forming a second insulating layer on the second semiconductor layer, removing the second insulating layer, the second semiconductor layer, and the second thermal oxide film except for portions corresponding to a base extraction region on the semiconductor substrate, forming a third semiconductor layer consisting of an amorphous or polycrystalline semiconductor on the major surface of the semiconductor substrate, doping an impurity of the first conductivity type in the third semiconductor layer, removing the third semiconductor layer except for a portion corresponding to the prospective base/emitter region, forming a third buried semiconductor region serving as an internal base region by recrystallizing the third semiconductor layer in the same crystal orientation as that of the semiconductor substrate and of the first and second buried semiconductor regions, forming a third insulating layer on the entire surface of the resultant semiconductor structure, forming a side wall consisting of the third insulating layer on a side surface of the second insulating film by etching back the third insulating layer, forming a fourth semiconductor layer consisting of an amorphous or polycrystalline semiconductor on the entire surface of the resultant semiconductor structure, doping an impurity of the second conductivity type in the fourth semiconductor layer, removing the fourth semiconductor layer except for a portion corresponding to the emitter and collector regions, forming a fourth insulating layer on the entire surface of the resultant semiconductor structure, forming an emitter region by doping an impurity of the third conductivity type in a surface region of the second buried semiconductor region using the fourth semiconductor layer as a diffusion source by annealing, and forming openings in portions of the fourth insulating layer above the emitter, base extraction, and collector extraction regions, and extracting emitter, base, and collector electrodes.

According to such a manufacturing method, since a low-concentration impurity region is formed by selective solid phase epitaxial growth instead of using an epitaxial substrate (a semiconductor substrate having an epitaxial layer formed thereon), annealing in the manufacturing process can be performed at a low temperature. Therefore, various problems due to the use of an epitaxial substrate can be solved. In addition, since solid phase epitaxial growth is performed twice, i.e. when a collector region is formed and when a base region is formed, the manufacturing process with excellent controllability of a carrier density distribution can be realized. Since the depth of an active layer is determined by the thickness of a semiconductor layer, controllability of the depth of the active layer is excellent. Moreover, a low-cost IC can be realized because no epitaxial substrate is used.

DETAILED DESCRIPTION OF THE PREFERRED EMBODIMENTS

Figure 1A:
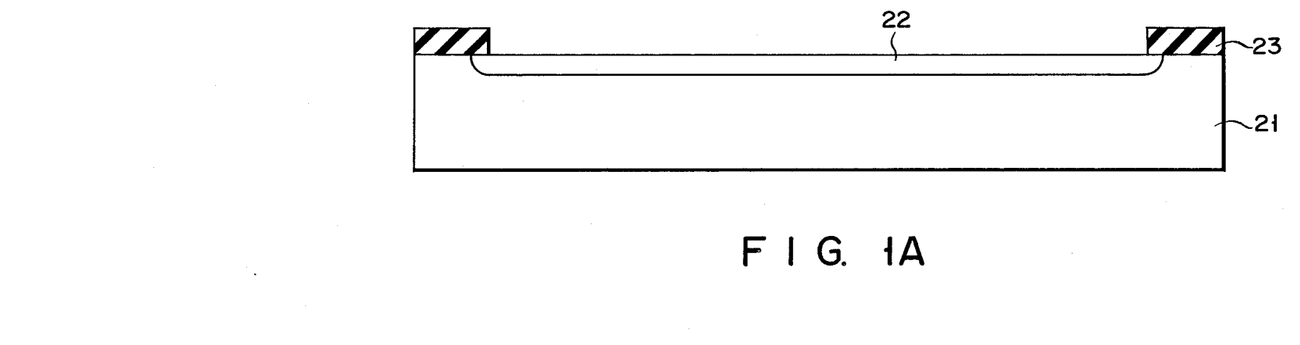
FIGS. 1A to 1N are sectional views for explaining the steps in manufacturing a bipolar transistor according to a first embodiment of the present invention.
Figure 1B:
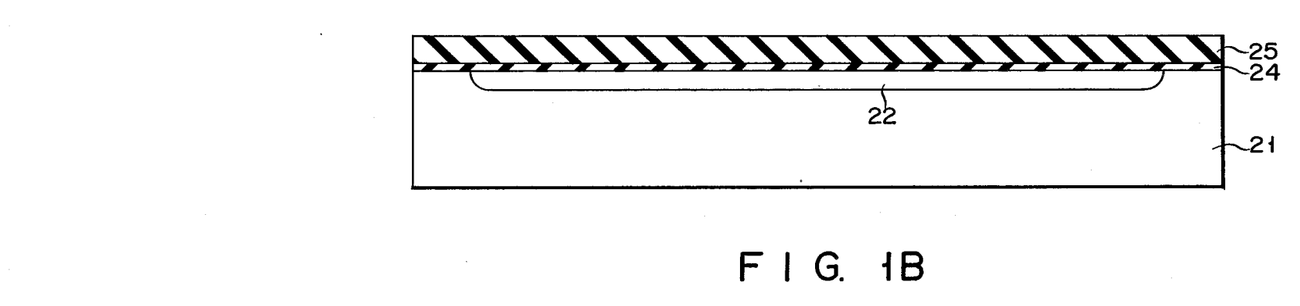
Figure 1C:
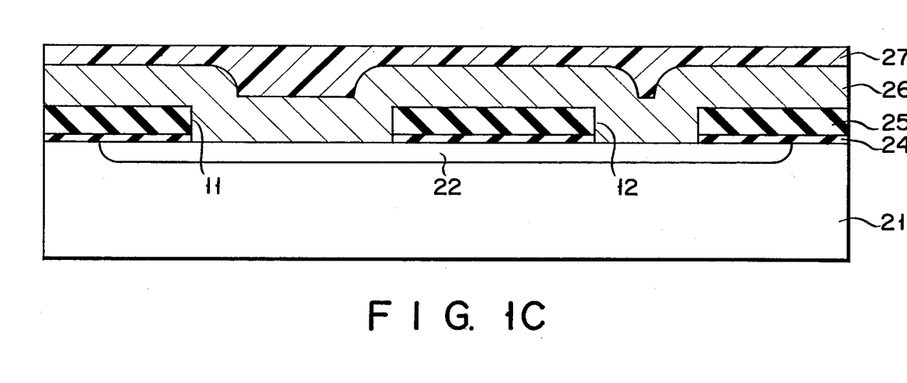
Figure 1D:
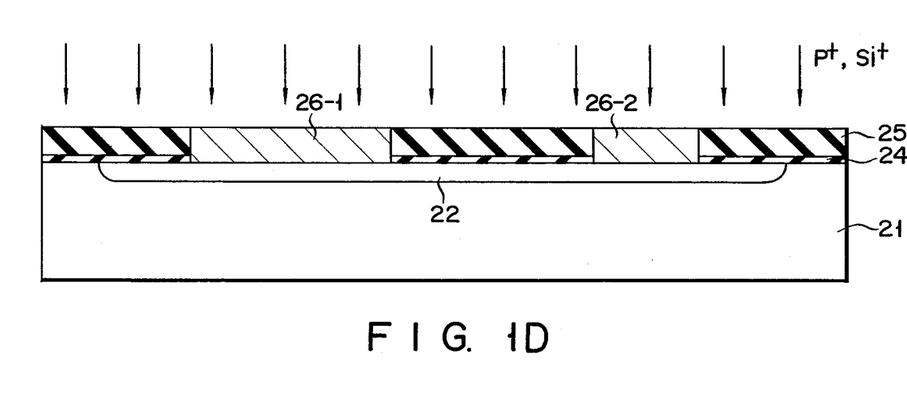
Figure 1E:
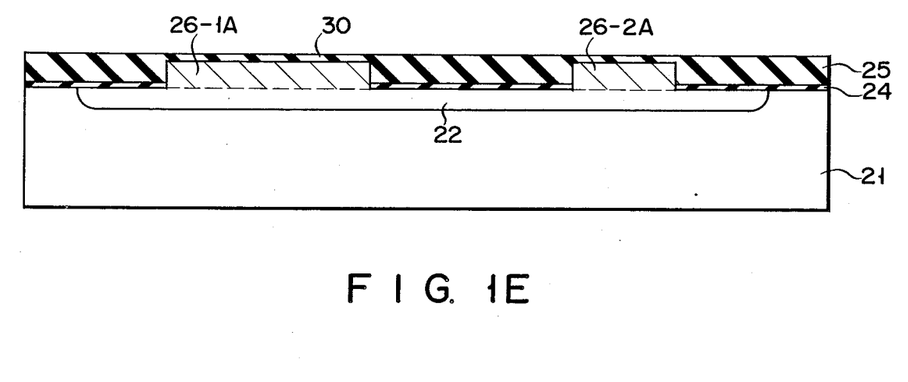
Figure 1F:
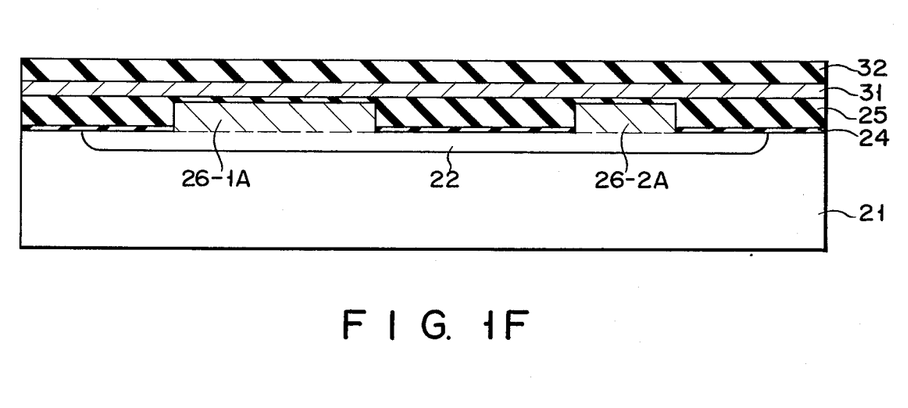
Figure 1G:
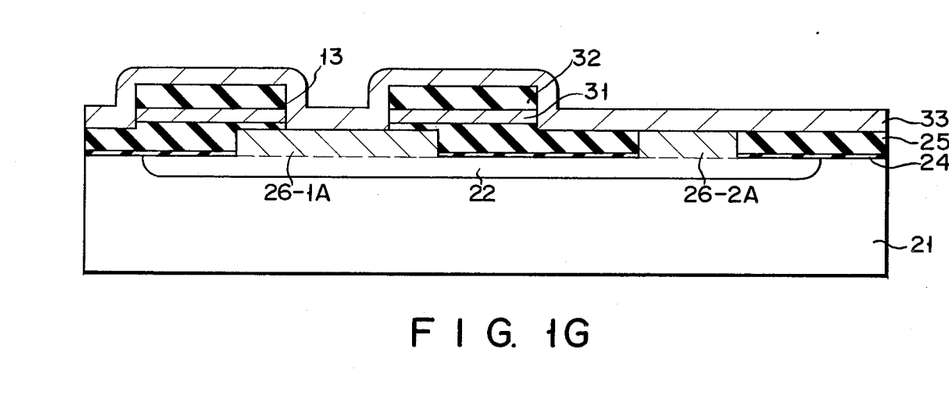
Figure 1H:
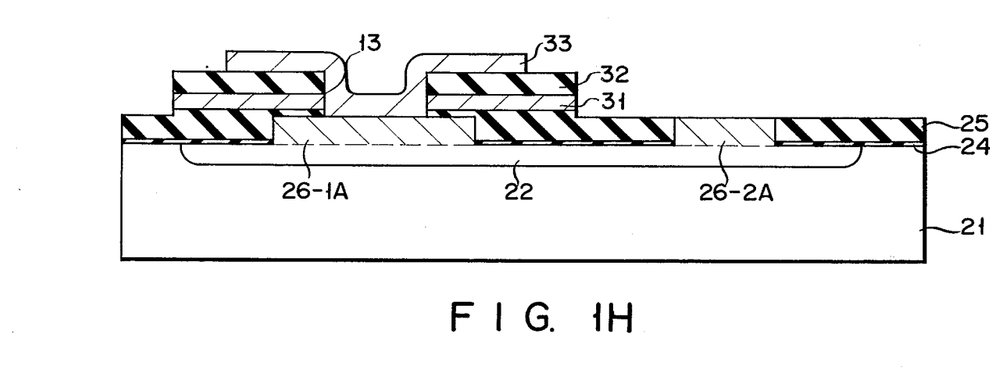
Figure 1I:
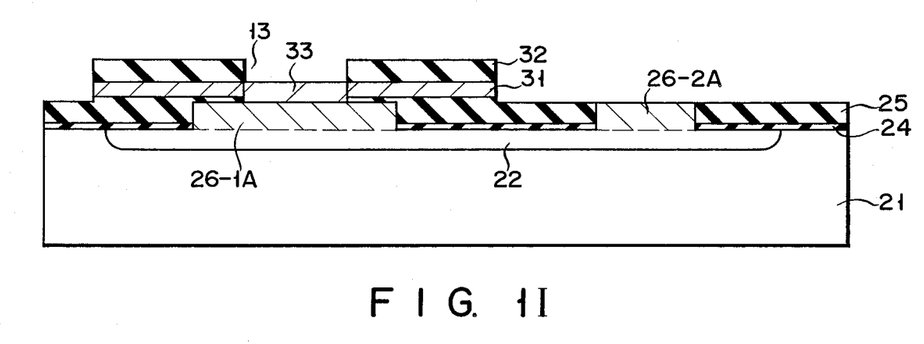
Figure 1J:
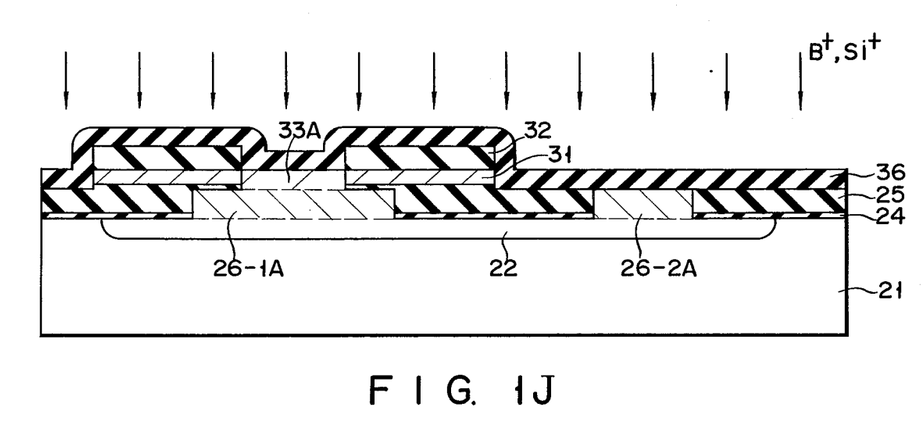
Figure 1K:
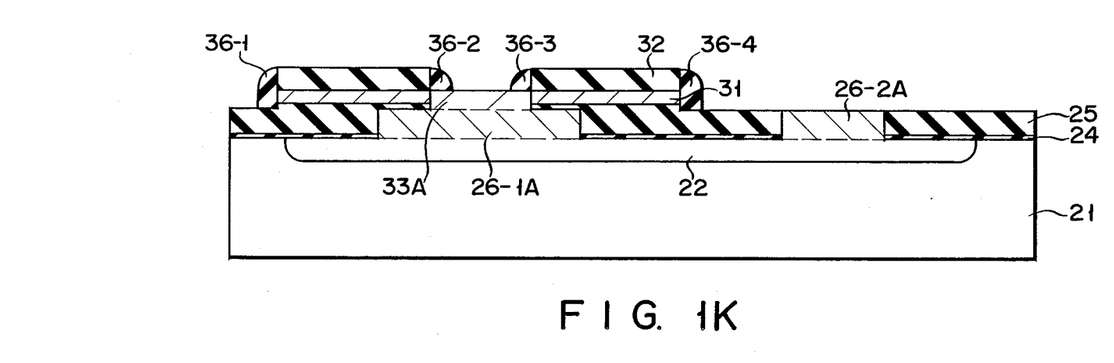
Figure 1L:
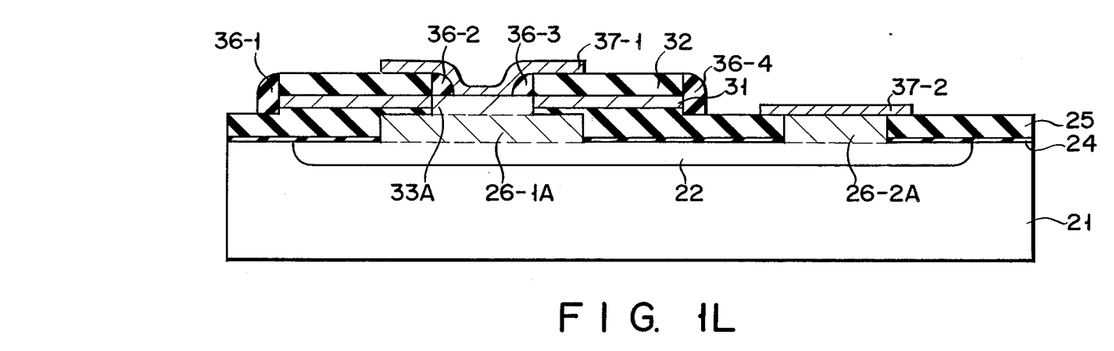
Figure 1M:
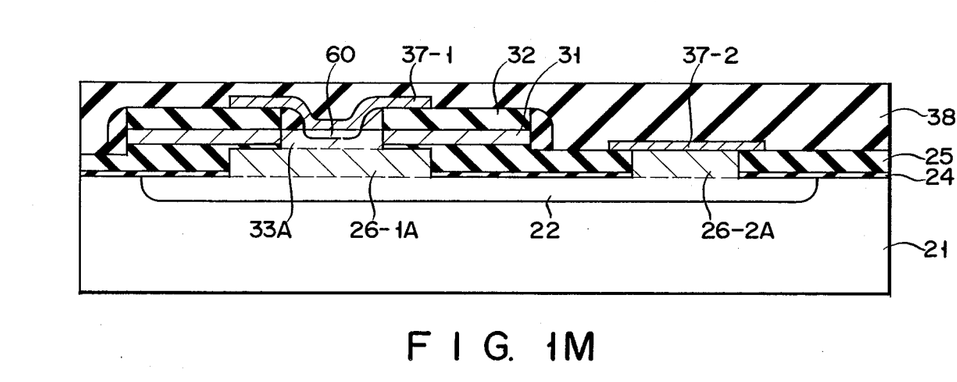
Figure 1N:
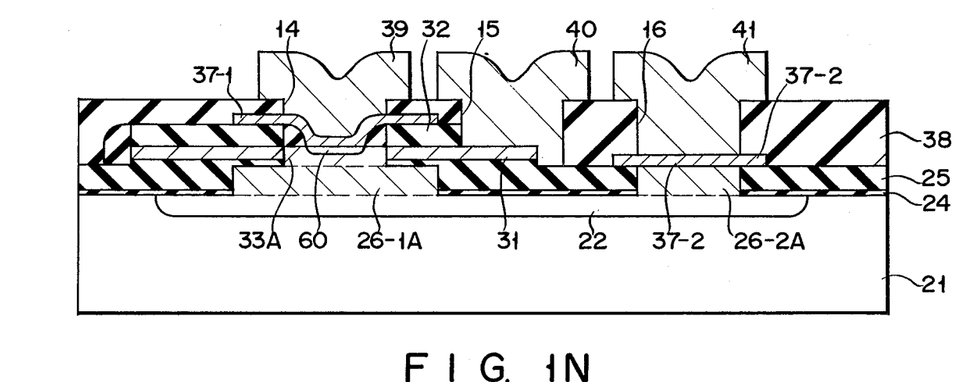

FIGS. 1A to 1N show the sequential steps of manufacturing a transistor according to a first embodiment of the present invention.

As shown in FIG. 1A, mask 23 for ion-implantation is formed on p-type semiconductor substrate 21. As+ ions are implanted in semiconductor substrate 21 through mask 23 to form n+-type buried layer 22 in a surface region of substrate 21. The As+ ions are implanted at an acceleration energy of about 40 keV and a dose of about $1 \times 10^{16}$ cm$^{-2}$. The impurity concentration of the surface of buried layer 22 is at least $1 \times 10^{19}$ cm$^{-3}$.

After mask 23 is removed, the surface of substrate 21 is thermally oxidized to form thermal oxide film 24 having a thickness of about 500 Å. SiO$_2$ film 25 having a thickness of about 3,000 Å is formed on thermal oxide film 24 by a CVD method to obtain a structure shown in FIG. 1B. Since the depth of a n$^-$-type collector region is determined by the thickness of CVD-SiO$_2$ film 25, if a high withstand voltage is desired, CVD-SiO$_2$ film 25 is deposited to a thickness larger than that in the above case.

A prospective base/emitter region and a prospective collector region of CVD-SiO$_2$ film 25 and thermal oxide film 24 are removed to form openings 11 and 12. Thereafter, 4,500-Å thick polysilicon layer (or amorphous layer) 26 is formed on SiO$_2$ film 25 and in openings 11 and 12. Since openings 11 and 12 must be completely filled with polysilicon layer 26, the thickness of polysilicon layer 26 is properly set in accordance with the thickness of SiO$_2$ film 25. Photoresist layer 27 is formed on polysilicon layer 26 to flatten the surface. With this process, a structure shown in FIG. 1C is obtained.

Subsequently, the entire surface of the structure is etched back by anisotropic dry etching to remove photoresist layer 27 and polysilicon layer 26. With this process, polysilicon layers 26-1 and 26-2 are respectively left in openings 11 and 12 serving as the prospective base/emitter region and the prospective collector region. In order to form an n$^-$-type collector region on the entire surface of the resultant semiconductor structure, an impurity is ion-implanted. This ion-implantation is performed three times under different conditions. In the first ion-implantation, phosphorus is ion-implanted at an acceleration energy of 180 keV and a dose of $5 \times 10^{11}$ cm$^{-2}$. In the second ion-implantation, phosphorus is ion-implanted at an acceleration energy of 90 keV and a dose of $3 \times 10^{11}$ cm$^{-2}$. In the third ion-implantation, phosphorus is ion-implanted at an acceleration energy of 40 keV and a dose of $1.5 \times 10^{11}$ cm$^{-2}$. In order to efficiently perform solid phase epitaxial growth, noncrystallization of polysilicon layers 26-1 and 26-2, and uniformity of the interface between substrate 21 and polysilicon layers 26-1 and 26-2 must be realized (for example, natural thermal oxide films partially formed on the interface need be removed). For this purpose, silicon ions (Si+) are implanted in the entire surface of the resultant semiconductor conductor structure. Upon this process, for example, natural thermal oxide films formed on the interface are broken. This ion-implantation is performed three times under different conditions in the same manner as described above. First, an acceleration energy and a does are set to be 180 keV and $1 \times 10^{16}$ cm$^{-2}$, respectively. In the second ion-implantation, they are set to be 90 keV and $6 \times 10^{15}$ cm$^{-2}$. In the third ion-implantation, they are respectively set to be 40 keV and $3 \times 10^{15}$ cm$^{-2}$. FIG. 1D shows this process.

Then, the resultant semiconductor structure is annealed in an N$_2$ atmosphere at 550° C. for about two hours. With this process, polysicicon layers 26-1 and 26-2 are formed into monocrystalline layers and first and second monocrystalline buried semiconductor regions (n$^-$-type collector regions) 26-1A are formed. Then, thermal oxide film 30 having a thickness of about 500 Å is formed on the surfaces of first and second buried semiconductor regions 26-1A and 26-2A by thermal oxidation, thereby obtaining a structure shown in FIG. 1E.

As shown in FIG. 1F, polysilicon layer 31 having a thickness of about 1,000 Å and containing $10^{18}$ to $10^{20}$ cm$^{31\ 3}$ of boron is formed on the entire surface of the resultant semiconductor structure by a CVD method. SiO$_2$ film 32 having a thickness of about 2,500 Å is formed on polysilicon layer 31 by a CVD method. Polysilicon layer 31 may be formed by adding boron to a reactive gas for the CVD process. It may be formed by forming an undoped polysilicon layer and then implanting boron ions (B+) therein.

Subsequently, portions of SiO$_2$ film 32 and polysilicon layer 31 except for those on a base extraction region are removed by anisotropic dry etching. As a result, opening 13 is formed on n$^-$-type collector region 26-1A. Then, thermal oxide film 30 is removed by wet etching. When 1,500-Å thick undoped polysilicon layer 33 is formed on the entire surface of the resultant semiconductor structure, a structure shown in FIG. 1G is obtained.

As shown in FIG. 1H, undoped polysilicon layer 33 is etched to remove its portions except for the portion corresponding to the prospective base/emitter region and its peripheral portion.

Remaining undoped polysilicon layer 33 is etched by a resist etch back method. Then, undoped polysilicon layer 33 is left in opening 13 as shown in FIG. 1I, and buried polysilicon layer 33 is formed on only the prospective base/emitter region.

Subsequently, ion-implantation is performed to form an internal base. This ion-implantation is performed such that, for example, boron ions (B+) are implanted at an acceleration energy of 30 keV and a dose of $1 \times 10^{14}$ cm$^{-2}$. In order to obtain a uniform interface between polysilicon layer 33 and collector region 26-1A and an amorphous structure of polysilicon layer 33, silicon ions (Si+) are implanted. The conditions of this ion-implantation are, for example, an acceleration energy of 100 keV and a dose of $1 \times 10^{16}$ cm$^{-2}$. Then, the resultant semiconductor structure is annealed in an N$_2$ atmosphere at 550° C. for about two hours. With this process, polysilicon layer 33 left in opening 13 is formed into a single crystal, and p-type third buried semiconductor region 33A (internal base) is formed. Then, 2,000-Å thick SiO$_2$ film 36 is formed on the entire surface of the resultant semiconductor structure by a CVD method, thereby obtaining a structure shown in FIG. 1J.

As shown in FIG. 1K, SiO$_2$ film 36 is etched back by anisotropic dry etching to form side walls 36-1 to 36-4 on side surfaces of SiO$_2$ film 32 and polysilicon layer 31.

As shown in FIG. 1L, As-doped polysilicon layers 37-1 and 37-2 (or As-doped SiC layers) are formed an internal base region 33A and collector region 26-2A. Arsenic may be doped in polysilicon layers 37-1 and 37-2 by using an ion-implantation method. Polysilicon layer 37-1 serves not only as a diffusion source to form the emitter region but also as an extraction electrode of this emitter. Polysilicon layer 37-2 serves not only as an extraction electrode of collector region 26-2A but also as a portion for decreasing the contact resistance between region 26-2A and a collector electrode to be described later.

As shown in FIG. 1M, SiO$_2$ film 38 is formed on the entire surface of the resultant semiconductor structure. Then, lamp anneal is performed at 1,000° C. for about 10 seconds. Upon annealing, arsenic is doped from polysilicon layer 37-1 into a surface region of internal base region 33A to form n+-type emitter region 60.

Subsequently, openings 14, 15, and 16 are formed in portions of SiO$_2$ film 38 above the emitter, collector extraction, and base regions, respectively. Thereafter, for example, an aluminum layer is deposited on the entire surface of the resultant semiconductor structure. Emitter, base, and collector electrodes 39, 40, and 41 are formed by patterning this aluminum layer.

According to the manufacturing method described above, an ultra-high-speed device can be stably manufactured. The manufacture of such a device can be stabilized because of the following reasons. Since each annealing process in the overall manufacturing processes is performed for a short period of time and at a low temperature, the occurrence of impurity redistribution can be minimized. In addition, the thickness of polysilicon layer 26 determines the depth of the collector region, and the thickness of polysilicon layer 33 determines the depth of the base region. Since the thicknesses of polysilicon layers 26 and 33 can be controlled with high precision, the depths of the active layers can be controlled with high precision. Furthermore, the carrier density distributions in the active layers can be controlled with high precision. In addition to an improvement in yield because of the abovedescribed stabilizing factors, since an expensive epitaxial substrate is not used, the manufacturing cost can be decreased.

Note that the present invention is not limited to the above described embodiment and can be variously applied. In the above embodiment, a method of manufacturing an npn bipolar transistor is described. However, the present invention can be applied to, e.g., a method of manufacturing a pnp bipolar transistor.

Figure 2A:
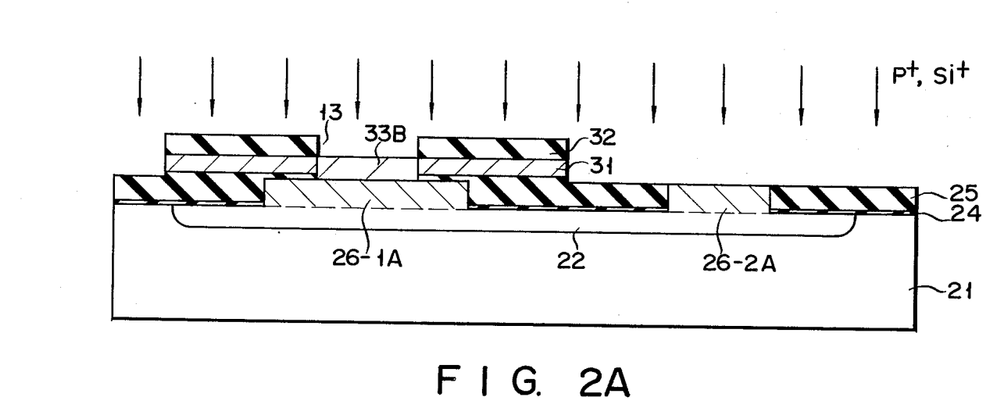
FIGS. 2A to 2F are sectional views for explaining th steps in manufacturing a lateral pnp transistor according to a second embodiment of the present invention.

FIGS. 2A to 2F show the steps of manufacturing a transistor according to a second embodiment of the present invention. In this embodiment, a lateral pnp transistor is formed by using substantially the same steps as in the above-described first embodiment. The steps shown in FIGS. 1A to 1I in the first embodiment are equivalent to those in the second embodiment. As shown in FIG. 2A, ion-implantation for forming an internal base is performed. This ion-implantation is performed such that, for example, phosphorus (P+) is ion-implanted at an acceleration energy of 50 keV and a dose of $2 \times 10^{13}$ cm$^{-2}$. Then, in order to obtain a uniform interface between polysilicon layers 26-1A and 33 and an amorphous structure of polysilicon layer 33, silicon ions (Si+) are implanted. The conditions of this ion-implantation are set to be, e.g., an acceleration energy of 100 keV and a dose of $1 \times 10^{16}$ cm$^{-2}$. The resultant semiconductor structure is annealed in an N$_2$ atmosphere at 550° C. for about two hours. With this process, polysilicon layer 33 is formed into a single crystal, and third n$^-$-type buried semiconductor region (internal base region) 33B is formed.

Figure 2B:
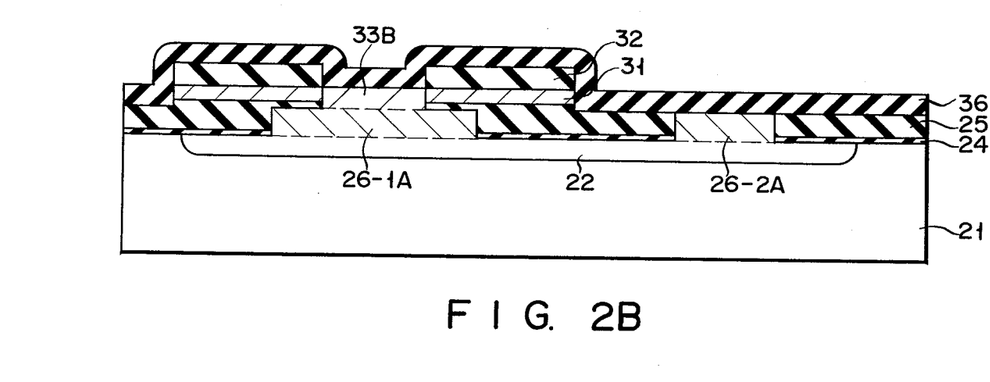

Subsequently, 2,000-Å thick SiO$_2$ film 36 is formed on the entire surface of the resultant semiconductor structure by a CVD method to obtain a structure shown in FIG. 2B.

Figure 2C:
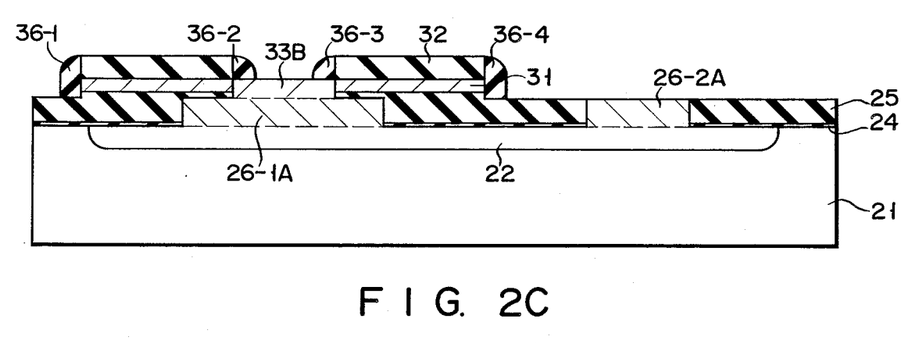

As shown in FIG. 2C, SiO$_2$ film 36 is etched back by anisotropic dry etching to form side walls 36-1 to 36-4 on side surfaces of SiO$_2$ film 32 and polysilicon layer 31.

Figure 2D:
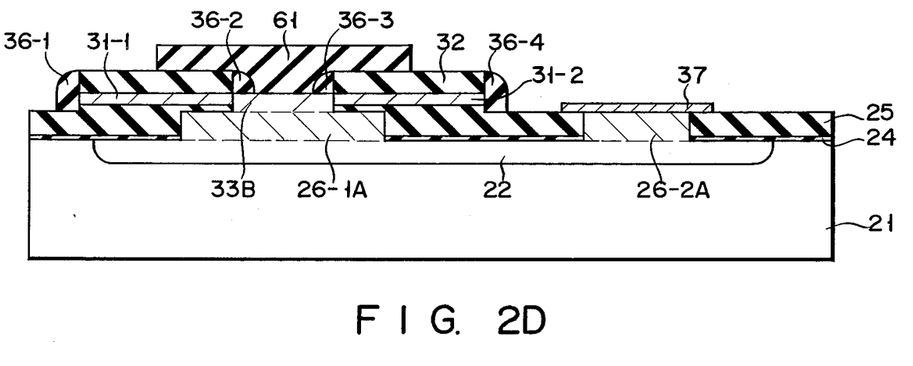

As-doped polysilicon layer 37 (or As-doped SiC layer) is formed on collector region 26-2A. Arsenic may be doped in polysilicon layer 37 by using an ion-implantation method. Polysilicon layer 37 serves not only as an extraction electrode of collector region 26-2A but also as a portion for decreasing the contact resistance between region 26-2A and a collector electrode to be described later. Field oxide film 61 is formed on n$^-$-type impurity region 33B, side walls 36-2 and 36-3, and SiO$_2$ film 32, and a structure shown in FIG. 2D is obtained. Field oxide film 61 is divided into two regions 31-1 and 31-2. Region 31-1 serves as a collector region and region 31-2 serves as an emitter region.

Figure 2E:
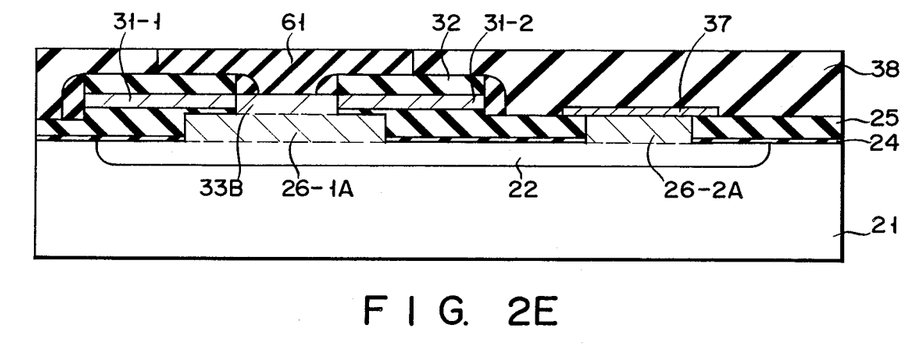
Figure 2F:
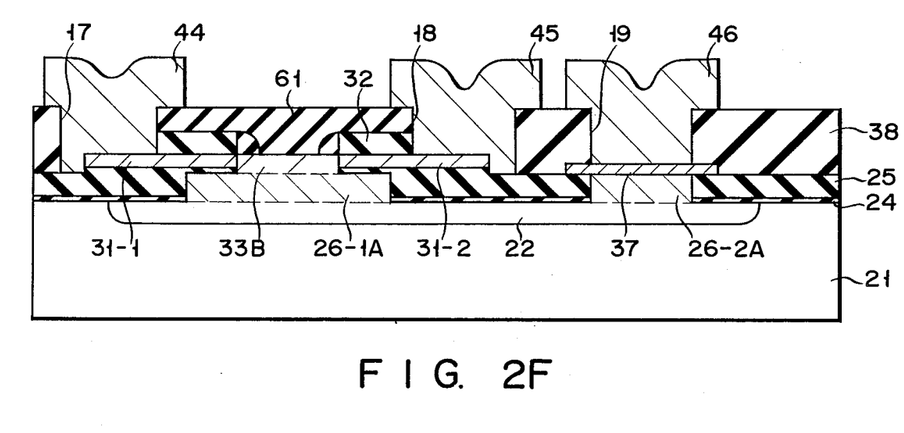

As shown in FIG. 2E, SiO$_2$ film 38 is formed on the entire surface of the resultant semiconductor structure. Then, lamp anneal is performed at 1,000° C. for about 10 seconds.

Subsequently, openings 17, 18, and 19 are formed in portions of SiO$_2$ film 38 above collector, emitter, and base regions 31-1, 31-2, and 26-A. An aluminum layer is deposited on the entire surface of the resultant semiconductor structure. Collector, emitter, and base electrodes 44, 45, and 46 are formed by patterning the aluminum layer, thereby obtaining a structure shown in FIG. 2F.

According to such a manufacturing method, since the same manufacturing steps as in the first embodiment are basically used, the same effects as in the first embodiment can be obtained.

Figure 3A:
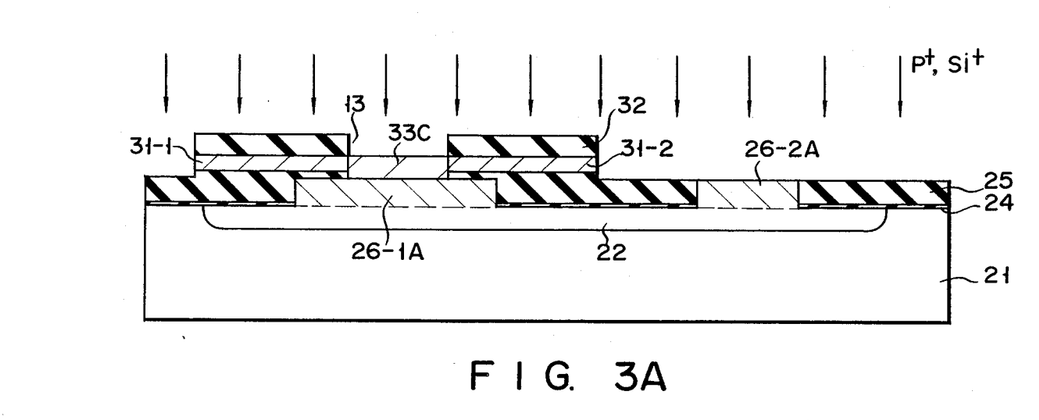
FIGS. 3A to 3F are sectional views for explaining the steps in manufacturing a MOS FET according to a third embodiment of the present invention.
Figure 3B:
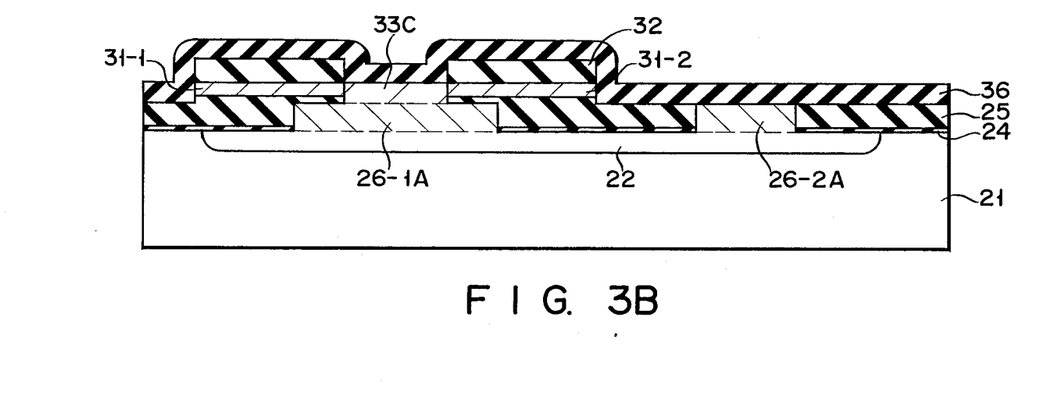

FIGS. 3A to 3F show the steps of manufacturing a transistor according to a third embodiment of the present invention. In the third embodiment, a MOS FET is formed by using substantially the same steps as in the first embodiment. Similar to the second embodiment shown in FIGS. 2A to 2F, the steps shown in FIGS. 1A to 1I in the first embodiment are equivalent to those in the third embodiment. According to the arrangement of the third embodiment, p-type polysilicon layers 31-1 and 31-2 serve as source and drain regions, respectively. Semiconductor layers 26-1A and 26-2A, which is composed of the monocrystalline polysilicon layer described above, and buried layer 22 serve as a back gate. As shown in FIG. 3A, ion-implantation for forming a channel region is performed. This is performed such that, e.g., phosphorus (P+) is ion-implanted at an acceleration energy of 50 keV and a dose of $2 \times 10^{12}$ cm$^{-2}$. Then, in order to obtain a uniform interface between semiconductor layers 26-1A and 33 and an amorphous structure of polysilicon layer 33, silicon ions are implanted. The conditions of this ion-implantation are set to be, e.g., an acceleration energy of 100 keV and a dose of $1 \times 10^{16}$ cm$^{-2}$. Annealing is performed in an N$_2$ atmosphere at 550° C. for about two hours. With this process, the polysilicon layer is formed into a single crystal, and third n$^-$-type buried semiconductor region (channel region) 33C is formed. When 2,000-Å thick SiO$_2$ film 36 is formed by a CVD method, a structure shown in FIG. 3B is obtained.

Figure 3C:
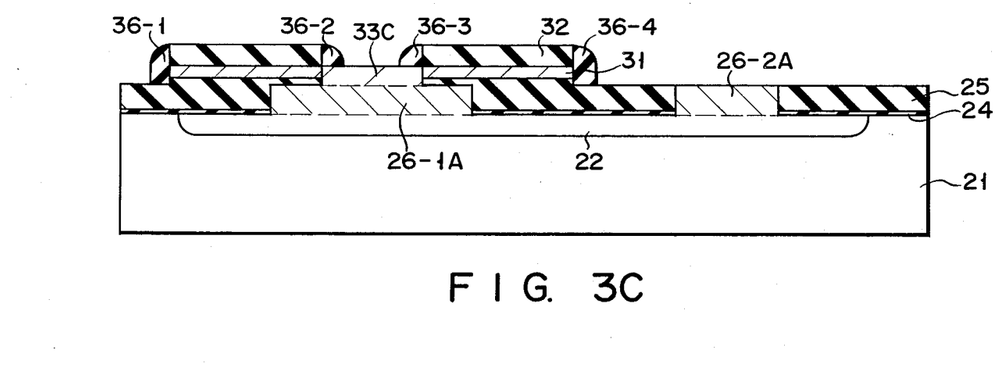
Figure 3D:
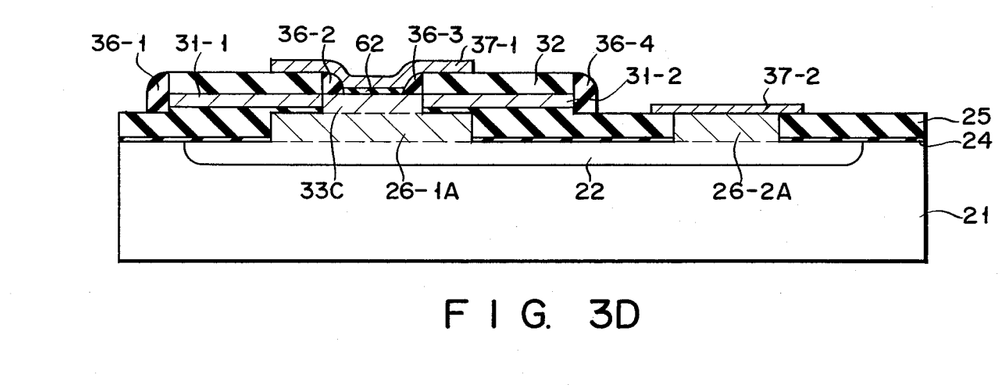

As shown in FIG. 3C, SiO$_2$ film 36 is etched back by anisotropic dry etching to form side walls 36-1 to 36-4 on side surfaces of SiO$_2$ film 32 and polysilicon layers 31-1 and 31-2.

The resultant semiconductor structure is then thermally oxidized to form thermal oxide film 62 serving as a gate oxide film on n$^-$-type impurity region (channel region) 33C. Thereafter, As-doped polysilicon layers (or As-doped SiC layers) 37-1 and 37-2 are formed above channel region 33C, thus obtaining a structure shown in FIG. 3D. As ions may be doped in polysilicon layer 37 by using an ion-implantation method. Polysilicon layer 37-1 serves as a gate extraction electrode. Polysilicon layer 37-2 serves not only as an extraction electrode of back gate 26-2A but also as a portion for decreasing the contact resistance between region 26-2A and a back gate electrode to be described later.

Figure 3E:
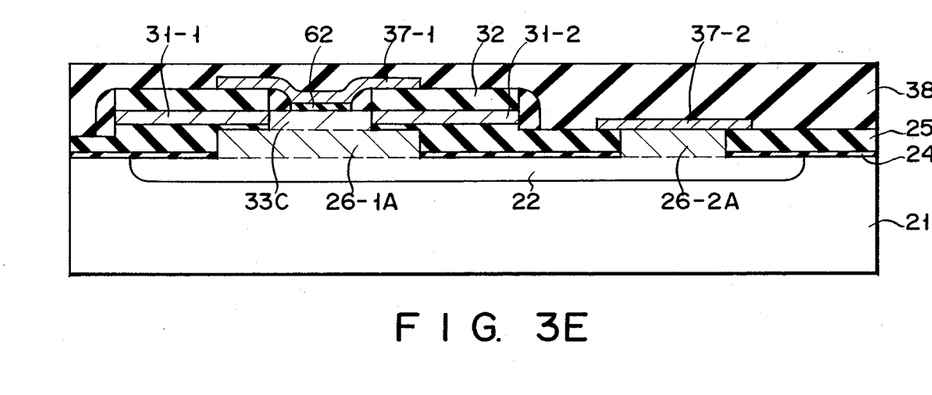
Figure 3F:
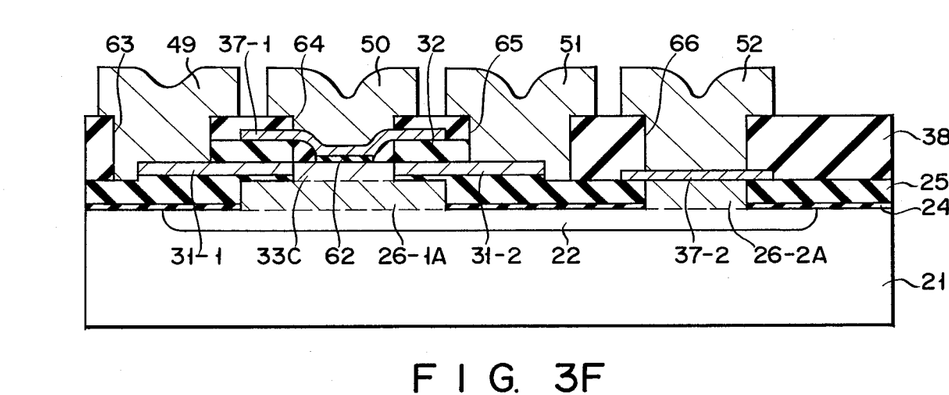

As shown in FIG. 3E, SiO$_2$ film 38 is formed on the entire surface of the resultant semiconductor structure. Then, lamp anneal is performed at 1,000° C. for about 10 seconds.

Openings 63, 64, 65, and 66 are formed in portions of SiO$_2$ film 38 above source region 31-1, gate extraction electrode 37-1, drain region 31-2, and back gate extraction electrode 37-2. Thereafter, for example, an aluminum layer is formed on the entire surface of the resultant semiconductor structure. This aluminum layer is patterned to form source, gate, drain, and back gate electrodes 49, 50, 51, and 52, thereby obtaining a structure shown in FIG. 3F.

According to such a manufacturing method, since substantially the same manufacturing processes as in the first embodiment are employed, the same effects as those therein can be obtained.

What is claimed is:

1. A method of manufacturing a semiconductor integrated circuit device comprising steps of:
   selectively forming a high-concentration impurity region of a second conductivity type in a major surface region of a semiconductor substrate of a first conductivity type;
   forming a first thermal oxide film on a major surface of said semiconductor substrate;
   forming a first insulating layer on said first thermal oxide film;
   forming first and second openings in prospective base/emitter and collector regions, respectively, of said first insulating layer and said first thermal oxide film on said high-concentration impurity region;
   burying/forming a first semiconductor layer consisting of an amorphous or polycrystalline semiconductor in said first and second openings;
   doping an impurity of the second conductivity type in said first semiconductor layer;
   forming first and second buried semiconductor regions serving as a collector region by recrystallizing said first semiconductor layer in the same crystal orientation as that of said semiconductor substrate;
   forming a second thermal oxide film by thermally oxidizing surfaces of said first and second semiconductor buried regions;
   forming a second semiconductor layer consisting of an amorphous or polycrystalline semiconductor on said second thermal oxide film;
   doping an impurity of the first conductivity type in said second semiconductor layer;
   forming a second insulating layer on said second semiconductor layer;
   removing said second insulating layer, said second semiconductor layer, and said second thermal oxide film except for portions corresponding to a base extraction region on said semiconductor substrate;
   forming a third semiconductor layer consisting of an amorphous or polycrystalline semiconductor on the major surface of said semiconductor substrate;
   doping an impurity of the first conductivity type in said third semiconductor layer;
   removing said third semiconductor layer except for a portion corresponding to the prospective base/emitter region;
   forming a third buried semiconductor region serving as an internal base region by recrystallizing said third semiconductor layer in the same crystal orientation as that of said semiconductor substrate and of said first and second buried semiconductor regions;
   forming a third insulating layer on the entire surface of the resultant semiconductor structure;
   forming a side wall consisting of said third insulating layer on a side surface of said second insulating film by etching back said third insulating layer;
   forming a fourth semiconductor layer consisting of an amorphous or polycrystalline semiconductor on the entire surface of the resultant semiconductor structure;
   doping an impurity of the second conductivity type in said fourth semiconductor layer;
   removing said fourth semiconductor layer except for a portion corresponding to the emitter and collector regions;
   forming a fourth insulating layer on the entire surface of the resultant semiconductor structure;
   forming an emitter region by doping an impurity of the second conductivity type in a surface region of said third buried semiconductor region using said fourth semiconductor layer as a diffusion source by annealing; and forming openings in portions of said fourth insulating layer above the emitter, base extraction, and collector extraction regions, and extracting emitter, base, and collector electrodes.

2. A method according to claim 1, further comprising a step of breaking natural oxide films on the major surface of said semiconductor substrate and on an interface between said buried semiconductor region and said semiconductor layer by implanting silicon ions after the steps of forming said first and third semiconductor layers.

3. A method according to claim 1, further comprising a step of implanting silicon ions to transform the crystalline semiconductor layer into an amorphous layer in addition to each of the steps of doping the impurities in said first or third semiconductor layers prior to the step of recrystallizing said first or third semiconductor layers.

4. A method according to claim 1, wherein said first and second conductivity types are P and N types, respectively.

5. A method according to claim 1, wherein a surface impurity concentration of said high-concentration impurity region of the second conductivity type formed on the major surface of said semiconductor substrate is at least $1 \times 10^{19}$ cm$^{-3}$.

6. A method according to claim 1, wherein said first, second, third, and fourth semiconductor layers are selected from the group consisting of polysilicon and amorphous silicon.

7. A method according to claim 1, wherein said first, second, and third semiconductor layers are selected from the group consisting of polysilicon and amorphous silicon, and said fourth semiconductor layer is selected from substances each having a band gap larger than that of silicon.

8. A method according to claim 7, wherein each of said substances has a band gap larger than that of the silicon include silicon carbide.

9. A method of manufacturing a semiconductor integrated circuit device comprising steps of:
selectively forming a high-concentration impurity region of a second conductivity type in a major surface region of a semiconductor substrate of a first conductivity type;
forming a first thermal oxide film on a major surface of said semiconductor substrate;
forming a first insulating layer on said first thermal oxide film;
forming first and second openings in prospective base and base extraction regions, respectively, of said first insulating layer and said first thermal oxide film on said high-concentration impurity region;
burying/forming a first semiconductor layer consisting of an amorphous or polycrystalline semiconductor in said first and second openings
doping an impurity of the second conductivity type in said first semiconductor layer;
forming first and second buried semiconductor regions serving as a base and base extraction regions by recrystallizing said first semiconductor layer in the same crystal orientation as that of said semiconductor substrate;
forming a second thermal oxide film by thermally oxidizing surfaces of said first and second semiconductor buried regions;

forming a second semiconductor layer consisting of an amorphous or polycrystalline semiconductor on said second thermal oxide film;
doping an impurity of the first conductivity type in said second semiconductor layer;
forming a second insulating layer on said second semiconductor layer;
removing said second insulating layer, said second semiconductor layer, and said second thermal oxide film except for portions corresponding to collector and emitter regions on said semiconductor substrate;
forming a third semiconductor layer consisting of an amorphous or polycrystalline semiconductor on the major surface of said semiconductor substrate;
doping an impurity of the second conductivity type in said third semiconductor layer;
removing said third semiconductor layer except for a portion corresponding to the prospective internal base region;
forming a third buried semiconductor region serving as an internal base region by recrystallizing said third semiconductor layer in the same crystal orientation as that of said semiconductor substrate and of said first and second buried semiconductor regions;
forming a third insulating layer on the entire surface of the resultant semiconductor structure;
forming a side wall consisting of said third insulating layer on a side surface of said second insulating film by etching back said third insulating layer;
forming a fourth semiconductor layer of the second conductivity type consisting of an amorphous or polycrystalline semiconductor on said base extraction region;
forming a field oxide film on said third buried semiconductor region, a part of said second insulating layer and a part of said side wall;
forming a fourth insulating layer on the entire surface of the resultant semiconductor structure; and
forming openings in portions of said fourth insulating layer above the collector, emitter, and base extraction regions, and extracting collector, emitter, and base electrodes.

10. A method according to claim 9, further comprising a step of breaking natural oxide films on the major surface of said semiconductor substrate and on an interface between said buried semiconductor region and said semiconductor layer by implanting silicon ions after the steps of forming said first and third semiconductor layers.

11. A method according to claim 9, further comprising a step of implanting silicon ions to transform the crystalline semiconductor layer into an amorphous layer in addition to each of the steps of doping the impurities in said first or third semiconductor layers prior to the step of recrystallizing said first or third semiconductor layers.

12. A method according to claim 9, wherein said first and second conductivity types are P and N types, respectively.

13. A method according to claim 9, wherein a surface impurity concentration of said high-concentration impurity region of the second conductivity type formed on the major surface of said semiconductor substrate is at least $1 \times 10^{19}$ cm$^{-3}$.

14. A method according to claim 9, wherein said first, second, third, and fourth semiconductor layers are selected from the group consisting of polysilicon and amorphous silicon.

15. A method of manufacturing a semiconductor integrated circuit device comprising steps of:
selectively forming a high-concentration impurity region of a second conductivity type in a major surface region of a semiconductor substrate of a first conductivity type;
forming a first thermal oxide film on a major surface of said semiconductor substrate;
forming a first insulating layer on said first thermal oxide film;
forming first and second openings in prospective channel and back gate extraction regions, respectively, of said first insulating layer and said first thermal oxide film on said high-concentration impurity region;
burying/forming a first semiconductor layer consisting of an amorphous or polycrystalline semiconductor in said first and second openings;
doping an impurity of the second conductivity type in said first semiconductor layer;
forming first and second buried semiconductor regions by recrystallizing said first semiconductor layer in the same crystal orientation as that of said semiconductor substrate;
forming a second thermal oxide film by thermally oxidizing surfaces of said first and second semiconductor buried regions;
forming a second semiconductor layer consisting of an amorphous or polycrystalline semiconductor on said second thermal oxide film;
doping an impurity of the first conductivity type in said second semiconductor layer;
forming a second insulating layer on said second semiconductor layer;
removing said second insulating layer, said second semiconductor layer, and said second thermal oxide film except for portions corresponding to perspective source and drain regions on said semiconductor substrate;
forming a third semiconductor layer consisting of an amorphous or polycrystalline semiconductor on the major surface of said semiconductor substrate;
doping an impurity of the second conductivity type in said third semiconductor layer;
removing said third semiconductor layer except for a portion corresponding to the prospective channel region;
forming a third buried semiconductor region serving as a channel region by recrystallizing said third semiconductor layer in the same crystal orientation as that of said semiconductor substrate and of said first and second buried semiconductor regions;
forming a third insulating layer on the entire surface of the resultant semiconductor structure;
forming a side wall consisting of said third insulating layer on a side surface of said second insulating film by etching back said third insulating layer;
forming a third thermal oxide film on said third buried semiconductor layer serving as a gate insulating film;
forming a fourth semiconductor layer of the second conductivity type consisting of an amorphous or polycrystalline semiconductor on said third thermal oxide film and said second buried semiconductor region;
forming a fourth insulating layer on the entire surface of the resultant semiconductor structure; and
forming openings in portions of said fourth insulating layer above the source, channel, drain, and back gate extraction regions, and extracting source, gate, drain, and back gate electrodes.

16. A method according to claim 15, further comprising a step of breaking natural oxide films on the major surface of said semiconductor substrate and on an interface between said buried semiconductor region and said semiconductor layer by implanting silicon ions after the steps of forming said first and third semiconductor layers.

17. A method according to claim 15, further comprising a step of implanting silicon ions to transform the crystalline semiconductor layer into an amorphous layer in addition to each of the steps of doping the impurities in said first or third semiconductor layers prior to the step of recrystallizing said first or third semiconductor layers.

18. A method according to claim 15, wherein said first and second conductivity types are P and N types, respectively.

19. A method according to claim 15, wherein a surface impurity concentration of said high-concentration impurity region of the second conductivity type formed on tee major surface of said semiconductor substrate is at least $1 \times 10^{19}$ cm$^{-3}$.

20. A method according to claim 15, wherein said first, second, third, and fourth semiconductor layers are selected from the group consisting of polysilicon and amorphous silicon.

* * * * *